(12) United States Patent
Kwak et al.

(10) Patent No.: US 7,115,909 B2
(45) Date of Patent: Oct. 3, 2006

(54) LIGHT EMITTING DEVICE AND METHOD OF MANUFACTURING THE SAME

(75) Inventors: Joon-seop Kwak, Gyeonggi-do (KR); Jae-hee Cho, Gyeonggi-do (KR)

(73) Assignee: Samsung Electro-Mechanics Co., Ltd., Suwon-Si (KR)

( * ) Notice: Subject to any disclaimer, the term of this patent is extended or adjusted under 35 U.S.C. 154(b) by 16 days.

(21) Appl. No.: 10/940,748

(22) Filed: Sep. 15, 2004

(65) Prior Publication Data
US 2005/0062051 A1    Mar. 24, 2005

(30) Foreign Application Priority Data
Sep. 19, 2003    (KR) ...................... 10-2003-0065219

(51) Int. Cl.
*H01L 29/10*    (2006.01)
*H01L 27/15*    (2006.01)
(52) U.S. Cl. .......................................... 257/79; 257/44
(58) Field of Classification Search ................. 257/79, 257/44
See application file for complete search history.

(56) References Cited

U.S. PATENT DOCUMENTS

| | | | |
|---|---|---|---|
| 5,563,422 A | 10/1996 | Nakamura et al. | |
| 6,047,590 A * | 4/2000 | Namerikawa et al. | 73/54.24 |
| 6,130,446 A * | 10/2000 | Takeuchi et al. | 257/99 |
| 6,172,382 B1 * | 1/2001 | Nagahama et al. | 257/94 |
| 6,497,944 B1 * | 12/2002 | Oku et al. | 428/212 |
| 6,573,537 B1 | 6/2003 | Steigerwald et al. | |
| 7,048,844 B1 * | 5/2006 | Chen et al. | 205/789.5 |
| 2003/0106489 A1 * | 6/2003 | Lung et al. | 117/84 |
| 2004/0094416 A1 * | 5/2004 | Chen et al. | 204/426 |
| 2005/0121681 A1 * | 6/2005 | Oku et al. | 257/97 |
| 2005/0139825 A1 * | 6/2005 | Song et al. | 257/44 |

OTHER PUBLICATIONS

Y. Watanabe et al., "Evolution of the memory effect of the current through ferroelectric p/p and p/n heterostructures", Solid State Ionics 108, 1998, pp. 109-115.

* cited by examiner

*Primary Examiner*—Long Pham
*Assistant Examiner*—Shrinivas H. Rao
(74) *Attorney, Agent, or Firm*—Buchanan Ingersoll & Rooney PC

(57) ABSTRACT

Provided is a light emitting device and a method of manufacturing the same. The light emitting device comprises a transparent substrate, an n-type compound semiconductor layer formed on the transparent substrate, an active layer, a p-type compound semiconductor layer, and a p-type electrode sequentially formed on a first region of the n-type compound semiconductor layer, and an n-type electrode formed on a second region separated from the first region of the n-type compound semiconductor layer, wherein the p-type electrode comprises first and second electrodes, each electrode having different resistance and reflectance.

2 Claims, 8 Drawing Sheets

LIGHT EMITTING DEVICE AND METHOD OF MANUFACTURING THE SAME

BACKGROUND OF THE INVENTION

This application claims the priority of Korean Patent Application No. 2003-65219 filed on Sep. 19, 2003 in the Korean Intellectual Property Office, the disclosure of which is incorporated herein in its entirety by reference.

1. Field of the Invention

The present invention relates to a light emitting device and a method of manufacturing the same, and more particularly, to a light emitting diode (LED) having a high emission efficiency, capable of operating at a low voltage and emitting blue and green lights, and a method of manufacturing the same.

2. Description of the Related Art

LEDs are widely used as a light source of an optical communication apparatus and a light source to visually display the operating state of an electronic apparatus. Accordingly, a variety of LEDs are provided according to the application fields of devices using LEDs. The range of use of LEDs has more expanded by semiconductor devices emitting a blue light or a green light.

FIG. 1 is an example of a conventional LED.

Referring to FIG. 1, an n-GaN layer 12 is formed on a substrate 10. The n-GaN layer 12 is divided into a first region R1, on which an active layer 14 is formed, and a second region R2, on which an n-type electrode 22 is formed. There is a step between the first and second regions R1 and R2. The active layer 14, a p-GaN layer 16, and a p-type electrode 18 are formed sequentially on the first region R1 of the n-GaN layer 12. Here, the p-type electrode 18, as a high reflective electrode, reflects the light emitted from the active layer 14 toward the substrate 10.

Due to the high contacting resistance between the p-GaN layer 16 and the p-type electrode 18 in the conventional LED, the emission efficiency is low at a predetermined voltage. The problem of low emission efficiency could be solved by increasing the operating voltage.

However, attempts to solve the low emission efficiency problem of the LED by simply applying a higher operating voltage to the p-type electrode 18, and maintaining the high contact resistance between the p-GaN layer 16 and the p-type electrode 18 run against the efforts to reduce the operating voltage. This can cause a new problem.

SUMMARY OF THE INVENTION

To solve the above and other problems, the present invention provides a LED capable of operating at a low operating voltage without reducing the emission efficiency, by lowering the contact resistance between a p-type electrode and a p-type compound layer, and a method of manufacturing the LED.

According to an aspect of the present invention, there is provided the LED comprising: at least an n-type compound semiconductor layer, an active layer, and a p-type compound semiconductor layer which are disposed between an n-type electrode layer and a p-type electrode layer, wherein the p-type electrode comprises first and second electrodes, each electrode having different characteristics of resistance and reflectance.

The first electrode may be formed of a lanthanum nickel oxide film at a predetermined thickness.

The second electrode may be formed of one selected from the group consisting of silver (Ag) film, aluminum (Al) film, rhodium (Rh) film, and tin (Sn) film.

According to another aspect of the present invention, there is provided a LED comprising: a transparent substrate; an n-type compound semiconductor layer formed on the transparent substrate; an active layer formed on a first region of the n-type compound semiconductor layer; a p-type compound semiconductor layer formed on the active layer; a contact resistance reducing film formed on the p-type compound semiconductor layer; a p-type electrode formed on the contact resistance reducing film; and an n-type electrode formed on a second region separated from the first region of the n-type compound semiconductor layer.

The contact resistance reducing film may be a lanthanum nickel oxide film.

The p-type electrode may be formed of one selected from the group consisting of silver (Ag) film, aluminum (Al) film, rhodium (Rh) film, and tin (Sn) film.

According to further another aspect of the present invention, there is provided a method of manufacturing a LED comprising: a first step of sequentially depositing an n-type compound semiconductor layer, an active layer, and a p-type compound semiconductor layer on a transparent substrate; a second step of exposing a predetermined portion of the n-type compound semiconductor layer by patterning sequentially the p-type compound semiconductor layer and the active layer; a third step of forming an n-type electrode on the disclosed region of the n-type compound semiconductor layer; a fourth step of forming a metal compound film on the patterned the p-type compound semiconductor layer; a fifth step of oxidizing the metal compound film; and a sixth step of forming a conductive reflection film on the oxidized metal compound film.

The fourth step may comprise a step forming a photosensitive film pattern for disclosing the p-type compound semiconductor layer on the p-type compound semiconductor layer, and forming a metal compound film contacting the disclosed portion of the p-type compound semiconductor layer on the photosensitive film pattern.

Also, a resultant in which the reflective film is formed is annealed under a nitrogen atmosphere.

According to further another aspect of the present invention, there is provided a method for manufacturing a LED, comprising: a first step of forming an n-type compound semiconductor layer on a transparent substrate; a second step of sequentially forming an active layer and a p-type compound semiconductor layer on the n-type compound semiconductor layer; a third step of patterning the p-type compound semiconductor layer and the active layer for exposing a predetermined portion of the n-type compound semiconductor layer; a fourth step of forming an n-type electrode on the exposed region of the n-type compound semiconductor layer; a fifth step of sequentially forming a metal compound film and a conductive reflection film on the patterned p-type compound semiconductor layer; and a sixth step of oxidizing the metal compound film.

The fifth step may comprise: a step of forming a photosensitive film pattern for exposing the p-type compound semiconductor layer on the p-type compound semiconductor layer; a step of forming a metal compound film contacting the disclosed predetermined portion of the p-type compound semiconductor layer on the photosensitive film pattern, and a step of forming a reflective film on the metal compound. After the sixth step, the photosensitive film pattern, together with the oxide of metal compound and the reflective film, may be removed.

Also, the oxidized metal compound film may be annealed under a nitrogen atmosphere.

In accordance with another aspect of the present invention, there is provided a method of manufacturing a LED, comprising: a first step of forming an n-type compound semiconductor layer, an active layer, a p-type compound semiconductor layer, a metal compound oxide film, and a conductive reflection film sequentially on a transparent substrate; a second step of sequentially exposing a predetermined portion of the n-type compound semiconductor layer by removing a predetermined portion of the conductive reflection film, the metal compound oxide film, the p-type compound semiconductor layer, and the active layer; and a third step of forming an n-type electrode on the exposed region of the n-type compound semiconductor layer.

The first step may comprise: a step of sequentially forming the n-type compound semiconductor layer, the active layer, and the p-type compound semiconductor layer on the transparent substrate; a step of forming a metal compound film on the p-type compound semiconductor layer; a step of oxidizing the metal compound film; and a step of forming a reflective film on the oxidize the metal compound film.

Also, the first step may comprise: a step of sequentially forming the n-type compound semiconductor layer, the active layer, and the p-type compound semiconductor layer on the transparent substrate; a step of forming a metal compound film on the p-type compound semiconductor layer; a step of forming the reflective film on the metal compound film; and a step of oxidizing the metal compound film.

The formed n-type electrode may be annealed under a nitrogen atmosphere.

In accordance with another aspect of the present invention, there is provided a method for manufacturing a LED, comprising: a first step of sequentially forming an n-type compound semiconductor layer, an active layer, a p-type compound semiconductor layer, a metal compound film, and a conductive reflection film on a transparent substrate; a second step of exposing a predetermined portion of the n-type compound semiconductor layer by removing a predetermined portion of the conductive reflection film, the metal compound film, the p-type compound semiconductor layer, and the active layer; and a third step of oxidizing the metal compound film.

Here, after the second and third steps, an n-type electrode may be formed on the exposed region of the n-type compound semiconductor layer.

According to the present invention, the metal compound film may be formed of a lanthanum nikel film, and the metal compound oxide film may be a lanthanum nickel oxide film. The reflective film may be formed of one selected from the group consisting of silver film, aluminum film, rhodium film, and tin film.

The present invention provides a material film between the reflective film used as a p-type electrode and the p-type compound semiconductor layer. The material film reduces the contact resistance between the reflective film and the p-type compound semiconductor layer and has a high reflectance. Accordingly, the present invention increases the efficiency at a lower operating voltage.

DETEAILED DESCRIPTION OF THE INVENTION

Figure 1:
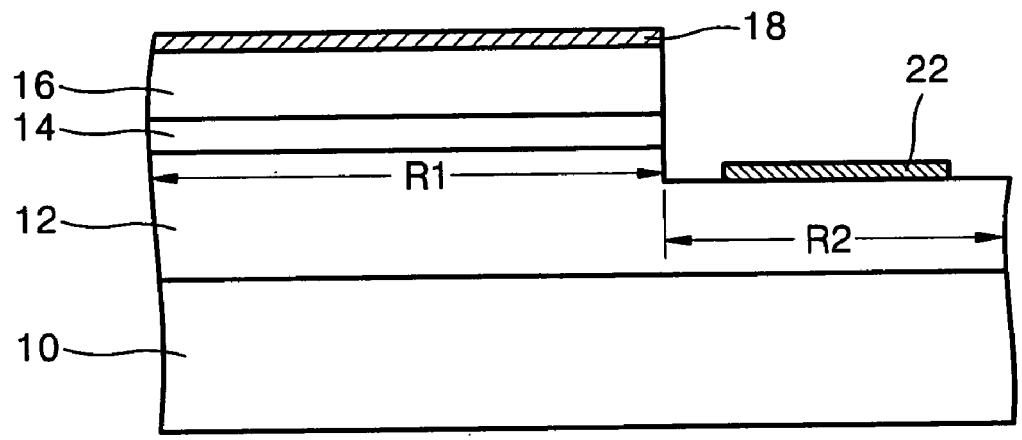
FIG. 1 is a cross-sectional view of a structure of a conventional LED.

Hereinafter, a light emitting device (LED) in accordance with the embodiments of the present invention will be described more fully with reference to the accompanying drawings. To facilitate understanding, the thickness of the films and regions in the drawings are exaggerated for clarity.

Figure 2:
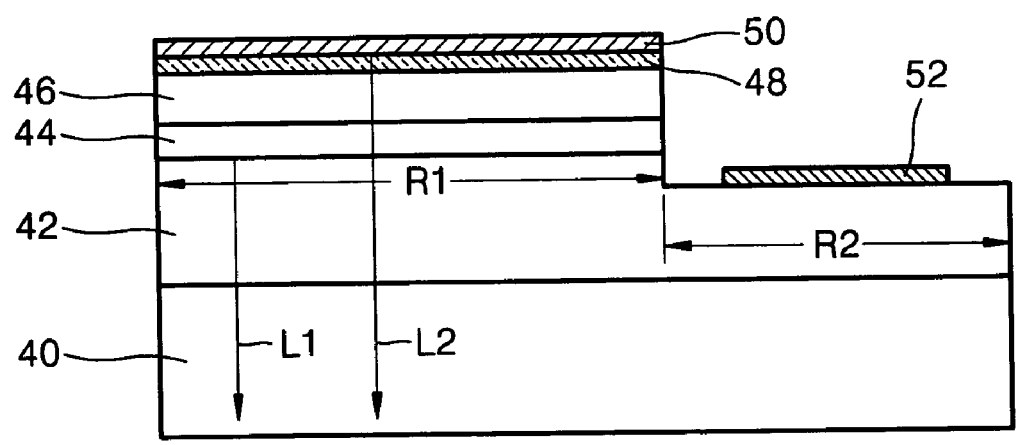
FIG. 2 is a cross-sectional view of a structure of a LED according to an embodiment of the present invention.

Referring to FIG. 2, a first compound semiconductor layer 42 is formed on a transparent substrate 40 of a LED according to the present invention. The first compound semiconductor layer 42 is preferably formed of an III-V group n-type semiconductor layer, for example, an n-GaN layer, but it can be formed of other semiconductor layers. The first compound semiconductor layer 42 is divided into a first region R1 and a second region R2. An active layer 44 emitting lights, such as blue or green light by recombining of the p-type and n-type carrier, is formed on the first region R1. A second compound semiconductor layer 46 is deposited on the active layer 44. The second compound semiconductor layer 46 is preferably formed of an III-V group p-type compound semiconductor layer, for example, a p-GaN layer, but it may be formed of other semiconductor layers. A contact resistance reducing film 48, reducing a contact resistance and having a high reflectance, and a reflective film 50 are sequentially deposited on the second compound semiconductor layer 46. The contact resistance reducing film 48 and the reflective film 50 form a p-type electrode. It is considered that the reflective film 50 is used as the p-type electrode, and the contact resistance reducing film 48 is used as a means for reducing the contact resistance between the reflective film 50 and the second compound semiconductor layer 46. The contact resistance reducing film 48 may be formed of a compound containing a lanthanide, for example, a lanthanum (La) and a nickel (Ni), preferably, a lanthanum nickel oxide film, such as $LaNiO_5$ film. The thickness of the contact resistance reducing film 48 is in the range of 1~100 nm, preferably, approximately 10 nm. The reflective film 50 having a higher reflectance relative to the contact resistance reducing film 48 is preferably formed of silver (Ag), but it may be formed of other materials, such as one selected from the group cosisting of aluminum (Al), rhodium (Rh), and tin (Sn).

An n-type electrode 52 is formed on the second region R2 of the first compound semiconductor layer 42.

A light is emitted from the active layer 44 toward the transparent substrate 40 and the reflective film 50 by applying a required voltage, i.e., more than a threshold voltage to the p-type electrode, which is formed by the reflective film 50 or the reflective film 50 and the contact resistance reducing film 48, and the n-type electrode. The light L1 emitted toward the transparent substrate 40 is discharged through the transparent substrate 40. The light emitted toward the reflective film 50 is discharged through the transparent substrate 40 after being reflected by the contact resistance reducing film 48 or the reflective film 50. A reference numeral L2 represents the light reflected by the reflective film 50.

The p-type electrode may be used as a p-type electrode of a light emitting device having p-type and n-type electrodes which face each other and of a light emitting device having a ridge wave guide. Also, the n-type electrode 52 of FIG. 2 may be formed on the bottom of the transparent substrate 40 when the transparent substrate 40 is a conductive substrate.

Figure 3:
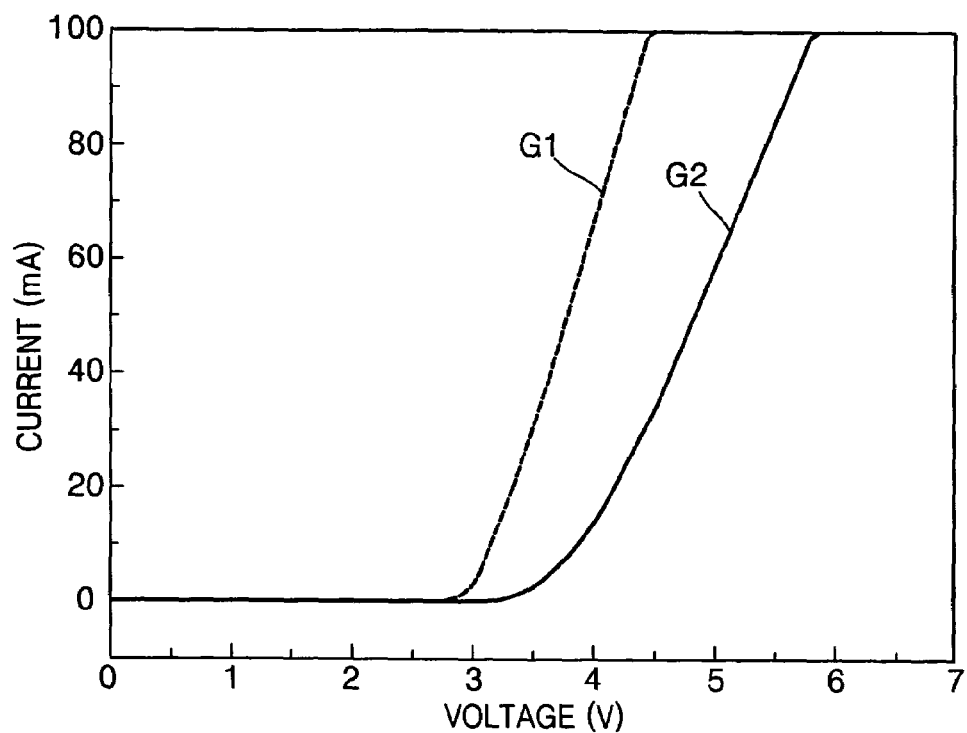
FIGS. 3 and 4 are graphs respectively showing current and reflectance characteristics of a contact resistance reducing film used in the LED of FIG. 2.

FIG. 3 shows the characteristics of current versus voltage of a LED according to the present invention and the conventional art. A reference numeral G1 in FIG. 3 represents a first graph of current versus voltage of a p-type electrode formed of lanthanide nickel oxide film (LaNiO) and silver film (Ag) of a LED according to the present invention, and a numeral G2 represents a second graph of current versus voltage of a p-type electrode formed of silver (Ag) of a LED according to the conventional art.

Referring to the first and the second graphs G1 and G2, it is seen that the LED according to the present invention commences operating at 3 volts, while, that of the conventional art commences operating at approximately 4 volts. That is, the operating voltage of the LED according to the present invention is reduced relative to the operating voltage of the conventional art by forming the p-type electrode with the contact resistance reducing film and the reflective film.

Figure 4:
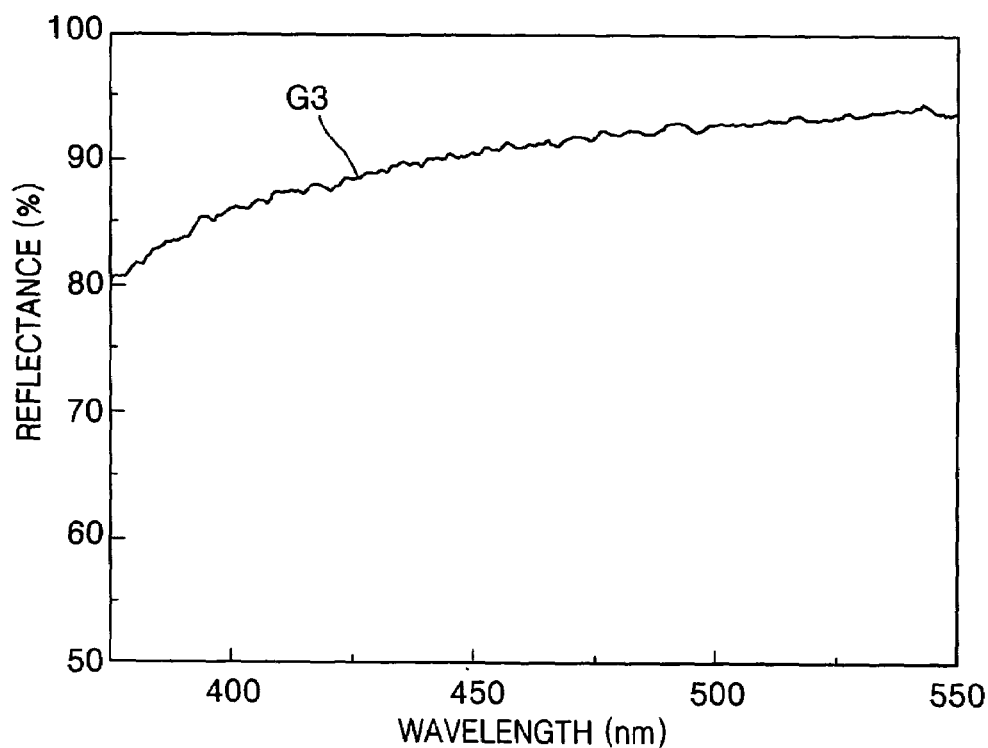

FIG. 4 shows a reflection characteristic of the lanthanide nickel oxide film having a thickness of 10 nm used as the contact resistance reducing film 48 of a LED according to the present invention. A reference numeral G3 represents a third graph showing the reflection characteristic of the lanthanide nickel oxide film.

Referring to FIG. 3, the lanthanide nickel oxide film shows a high reflectance characteristic in all visible light range, for example, 85% in a short wavelength of 400 nm.

Likewise, due to the superior reflectance of the lanthanide nickel oxide film used as the contact resistance reducing film 48, the amount of light reflected to the transparent substrate 40 among the light discharged toward the reflective film 50 by the active layer 44 is increased compare to a case when there is no contact resistance reducing film 48.

Accordingly, the amount of light discharged through the transparent substrate 40 of a LED according to the present invention is larger than that discharged through a reflective film 50 formed only by p-type electrode of the conventional art. That is, the emission efficiency of the present invention is higher than that of the conventional art at the same level of operating voltage.

From the FIGS. 3 and 4, it is seen that a LED according to the present invention is capable of operating at a lower voltage with a high light emission efficiency compared to a LED of the conventional art.

Now, a method of manufacturing a LED of FIG. 2 will be described.

First Embodiment

Figure 5:
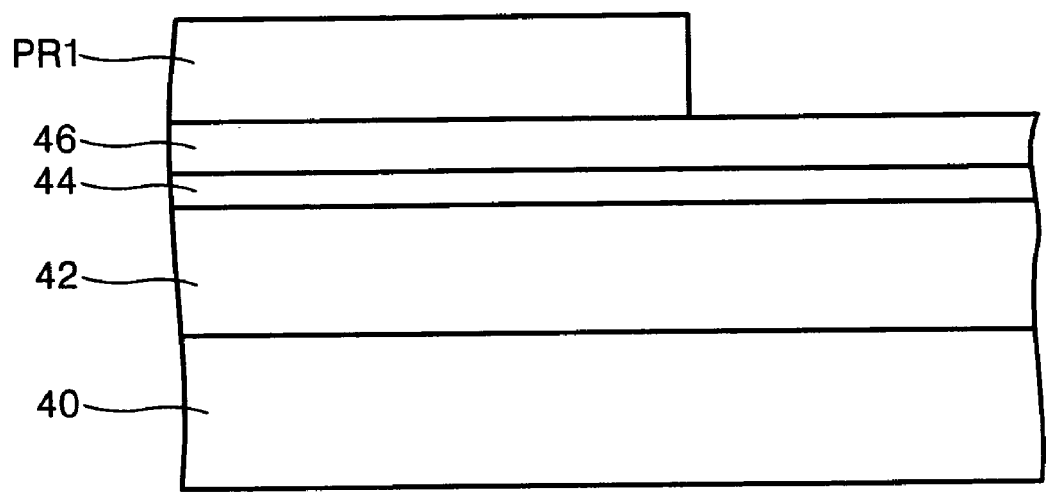
FIGS. 5 through 15 are cross-sectional views showing steps of a method of manufacturing the LED of FIG. 2 according to a first embodiment of the present invention (FIGS. 5 through 10), a second embodiment of the present invention (FIGS. 11 and 12), and a third embodiment of the present invention (FIGS. 13 through 15).

Referring to FIG. 5, a first compound semiconductor layer 42 is formed on a transparent substrate 40. The first compound semiconductor layer 42 is preferably formed of n-GaN layer, but it can be formed of other compound semiconductor layer. An active layer 44 and a second compound semiconductor layer 46 are formed sequentially on the first compound semiconductor layer 42. The second compound semiconductor layer 46 can be formed of p-GaN layer, but it can be formed of other compound semiconductor layer. A first photosensitive film pattern PR1 is formed on the second compound semiconductor layer 46. The first photosensitive film pattern PR1 defines regions for an n-type electrode and a p-type electrode, which will be later formed.

Figure 6:
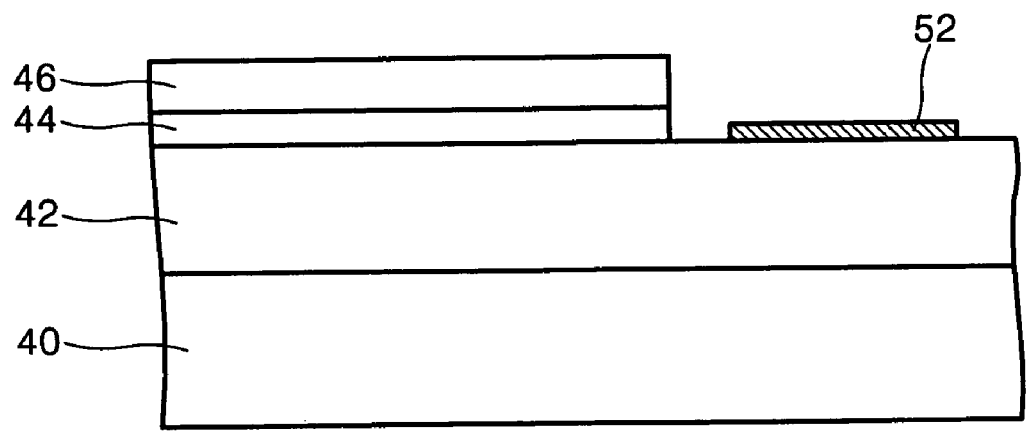

Referring to FIGS. 5 and 6, the second compound semiconductor layer 46 and the active layer 44 are sequentially etched by using the first photosensitive film pattern PR1 as an etching mask. Preferably, the etching can be done until the first compound semiconductor layer 42 is exposed, but it can be continued until a predetermined thickness of the first compound semiconductor layer 42 is removed. Afterward, the first photosensitive film pattern PR1 is removed. An n-type electrode 52 is formed on the predetermined region where the exposed region by etching of the first compound semiconductor layer 42. The n-type electrode 52 can be formed after the following processes are completed.

Figure 7:
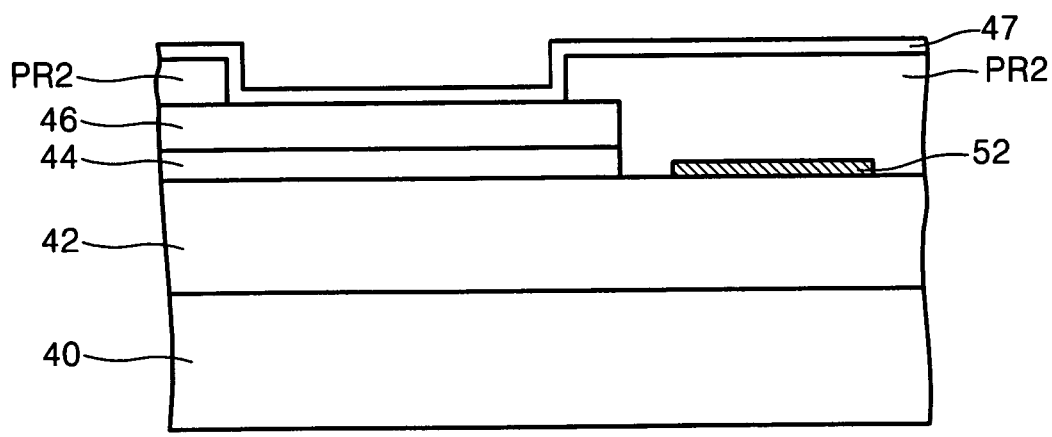

Referring to FIG. 7, a second photosensitive film pattern PR2 is formed covering the whole region of the n-type electrode 52 formed including the n-type electrode 52, and exposing the majority of the second compound semiconductor layer 46. The second photosensitive film pattern PR2 defines a region for forming the p-type electrode. A metal compound film 47 is formed contacting the whole surface of the second compound semiconductor layer 46 on the second photosensitive film pattern PR2. The metal compound film 47 is preferably formed of lanthanide nickel compound (LaNi), but it can be formed of other metal compound film. The metal compound film 47 can have a thickness in the range of 1~100 nm, preferably, it is formed having a thickness of 10 nm. The metal compound film 47 may be formed differently depending on the film material used.

Figure 8:
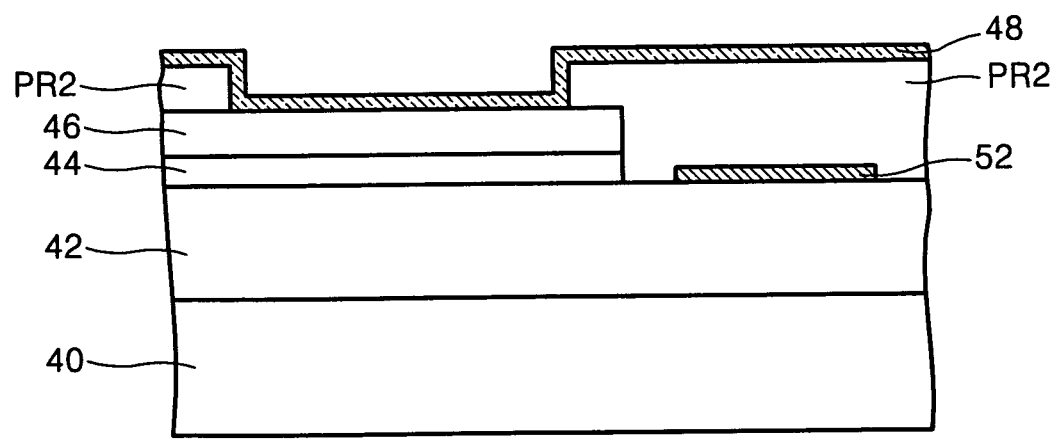

Next, the resultant metal compound film 47 is oxidized by annealing for a predetermined time at a predetermined temperature under an oxidizing atmosphere. Then, a contact resistance reducing film 48 contacting the whole surface of the disclosed region of the second compound semiconductor layer 46 is formed on the second photosensitive film pattern PR2 as depicted in FIG. 8. The contact resistance reducing film 48, as a high reflectance material film having a low electrical resistance as foregoing description, is preferably formed of lanthanide nickel oxide film, such as $LaNiO_5$, but it can be formed of other oxide films.

Figure 9:
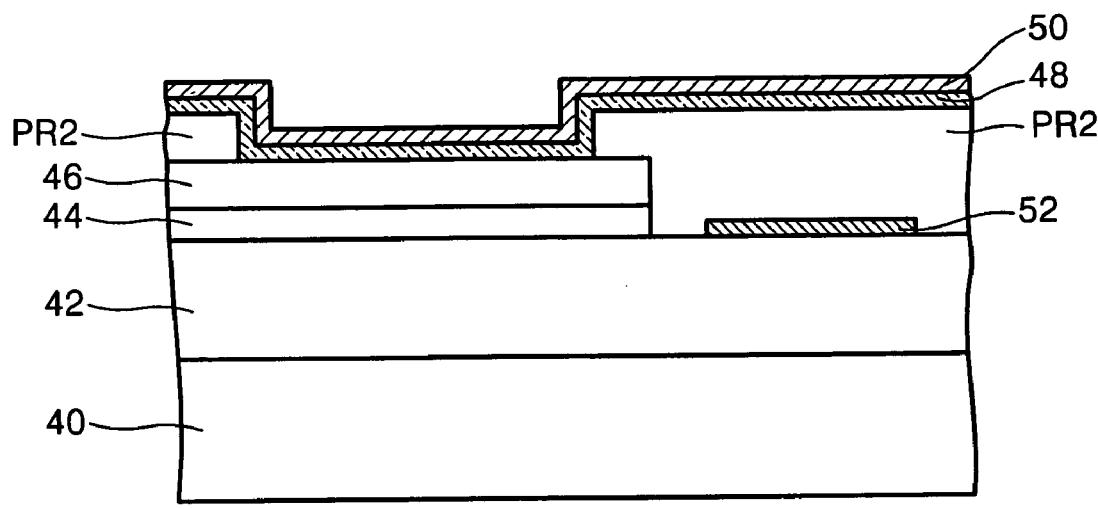

Referring to FIG. 9, a reflective film 50 is formed on the contact resistance reducing film 48. The reflective film alone can be used as the p-type electrode, but the contact resistance reducing film 48 also can be used as an electrode considering the characteristic of resistance of the contact resistance reducing film 48. Therefore, the p-type electrode can be formed of both the reflective film 50 and the contact resistance reducing film 48. The reflective film 50 preferably can be formed of silver (Ag), but it can be formed of other materials having a high reflectance that can be used as an electrode, such as aluminum, rhodium, or tin.

Figure 10:
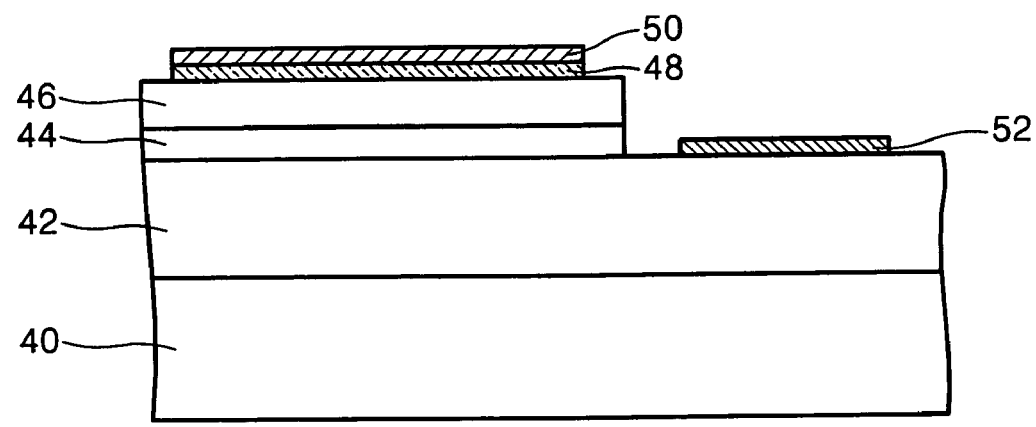

Referring to FIGS. 9 and 10, the second photosensitive film pattern PR2 is removed from the resulting product where the reflective film 50 is formed in FIG. 9. In this removing process, the contact resistance reducing film 48 and the reflective film 50 deposited sequentially on the second photosensitive film pattern PR2 are also removed. As the result, the contact resistance reducing film 48 and the reflective film 50, which will be used as the p-type electrode, are formed on the second compound semiconductor layer 46.

Second Embodiment

Figure 11:
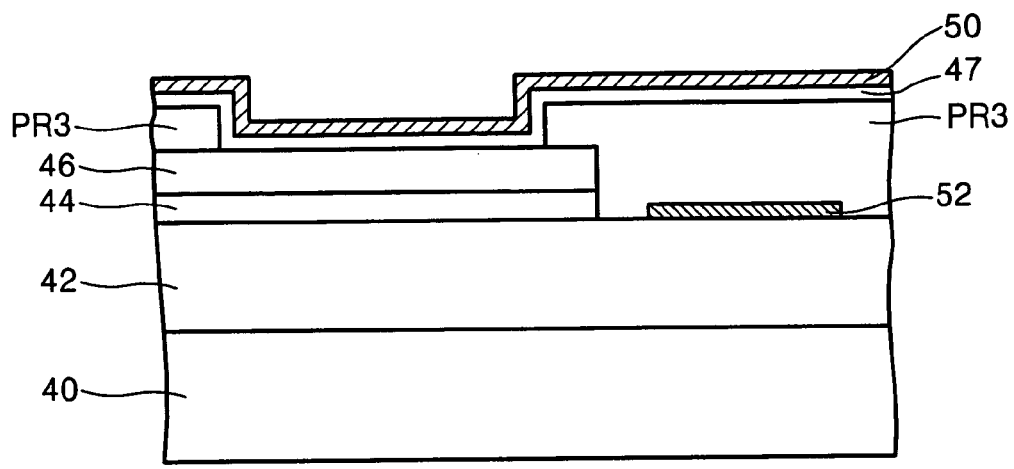
Figure 12:
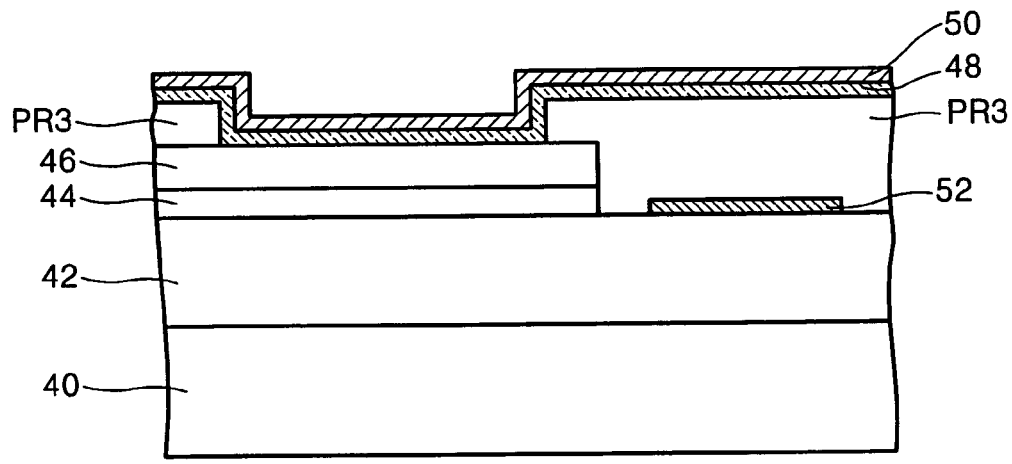

The same processes of the first embodiment for forming the first compound semiconductor layer 42, the active layer 44, and the second compound semiconductor layer 46 on the transparent substrate 40, etching the layers in reverse order, and forming the n-type electrode 52 on the disclosed region of the first compound semiconductor layer 42 are conducted. Accordingly, the descriptions of the material films in the first embodiment will be omitted Referring to FIG. 11, a third photosensitive film pattern PR3 is formed covering the region of the n-type electrode 52 formed including the n-type electrode 52, and disclosing the majority of the second compound semiconductor layer 46. The third photosensitive film pattern PR3 defines a region for forming the p-type electrode. A metal compound film 47 and a reflective film 50 are formed sequentially on the third photosensitive film pattern PR3. Next, the resulting product having the reflective film 50 is annealed to oxidize the metal compound film 47 as the same condition as described in the first embodiment under the oxidizing atmosphere. The metal compound film becomes a metal compound oxide film by annealing, and then a contact resistance reducing film 48 is formed between the reflective film 50 and the second compound semiconductor layer 46 as depicted in FIG. 12.

Afterward, by removing the third photosensitive film pattern PR3 together with the contact resistance reducing film 48 and the reflective film 50 which were deposited sequentially, the resulting product as depicted in FIG. 10 is obtained. The n-type electrode 52 can be formed after removing the third photosensitive film pattern PR3.

Third Embodiment

The descriptions the material films in the first and the second embodiments will be omitted.

Figure 13:
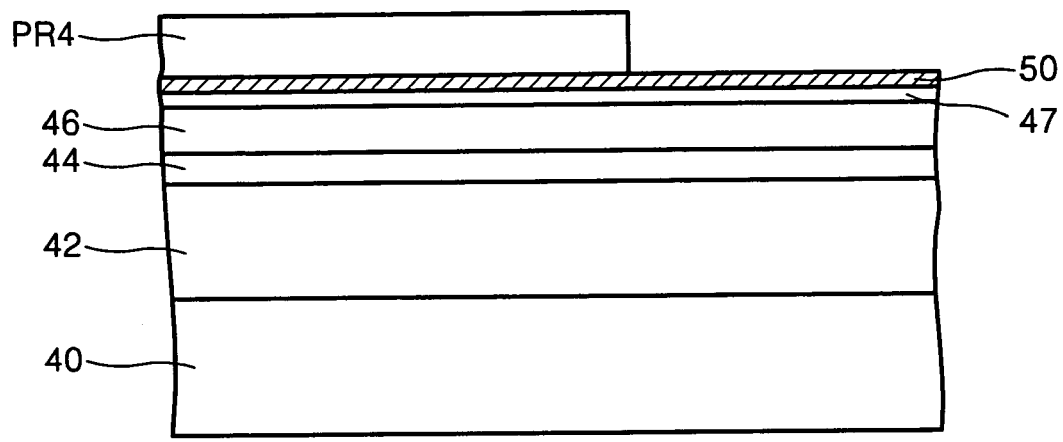

Referring to FIG. 13, a first compound semiconductor layer 42, the active layer 44, the second compound semiconductor layer 46, the metal compound film 47, and the reflective film 50 are sequentially deposited on the transparent substrate 40. A fourth photosensitive film pattern PR4 which defines the region for p-type electrode is formed on the reflective film 50.

Figure 14:
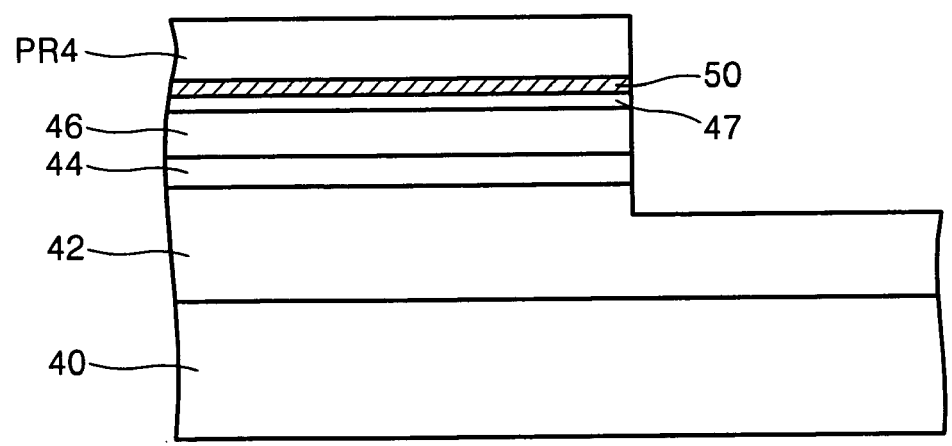

Next, as depicted in FIG. 14, the deposited material films on the first compound semiconductor layer 42 are etched in reverse order by using the fourth photosensitive film pattern PR4 as an etching mask. Here, the etching preferably can be done until the first compound semiconductor layer 42 is disclosed, but it can be continued until a predetermined thickness of the first compound semiconductor layer 42 is removed. A portion of the region of the first compound semiconductor layer 42 is disclosed by etching. An n-type electrode will be formed on the disclosed region of the first compound semiconductor layer 42 in the following process. After etching, the fourth photosensitive film pattern PR4 is removed by ashing and stripping.

Figure 15:
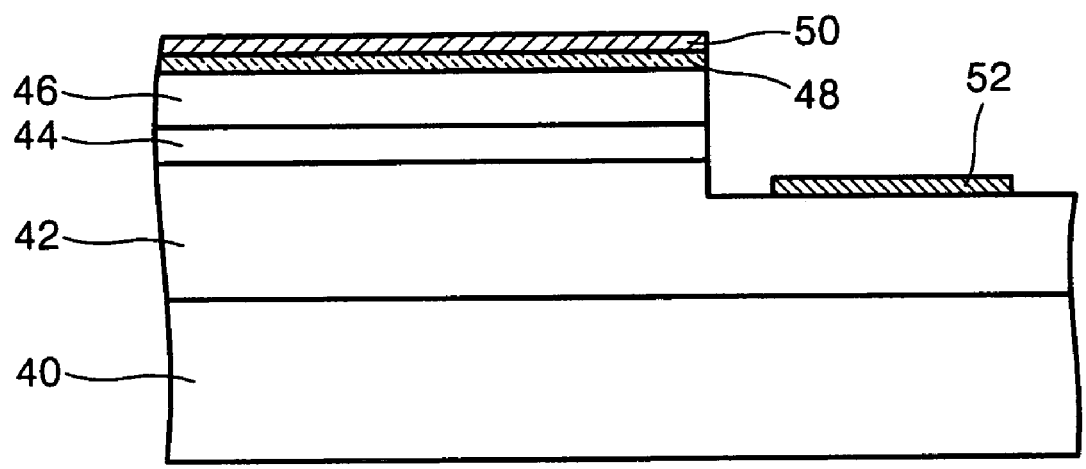

Referring to FIGS. 14 and 15 together, after removing the fourth photosensitive film pattern PR4, the resulting product is annealed as the same condition as described in the first embodiment under oxidizing atmosphere. Then, the metal compound film 47 is oxidized, and a contact resistance reducing film 48 is formed between the second compound semiconductor layer 46 and the reflective film 50.

Fourth Embodiment

The fourth embodiment is characteristic in that, prior to forming the reflective film 50 on the metal compound film 47 as depicted in FIG. 13 in the third embodiment, the oxidation of the metal compound 47 is performed in advance to form a metal compound film. After that, a fourth photosensitive film pattern PR4 is formed on the reflective film 50. By using the fourth photosensitive film pattern PR4 as an etching mask, the reflective film 50, the oxidized metal compound film, the second compound semiconductor layer 46, and the active layer 44 are etched sequentially. Then, the fourth photosensitive film pattern PR4 is removed.

In the method of manufacturing a LED according to the first through fourth embodiments, after forming the p-type electrode, which comprises the contact resistance reducing film 48 and the reflective film 50, formed on the second compound semiconductor layer 46, the resulting product can be heat treated under a nitrogen atmosphere. The heat treatment temperature can be in the range of 300~900° C. for a predetermined time.

The LED according to the present invention provides a material film having a low contacting resistance and a high reflectance formed between a reflective film, which is used as a p-type electrode, and a p-type compound semiconductor layer. Accordingly, the use of the LED according to the present invention allows operating at a low voltage and increasing the emission efficiency.

While this invention has been particularly shown and described with reference to embodiments thereof, it should not be construed as being limited to the embodiments set forth herein but as an exemplary. This invention may, however, be embodied in many different forms by those skilled in this art. For example, the reflective film can be formed of double layers. Also, the technical thought of the present invention can be applied to a LED having a p-type electrode and an n-type electrode formed not in a same direction. Further, the oxidation process for converting a metal compound film to a contact resistance reducing film may adopt other method than annealing method. Likewise, since the present invention can be made in many different forms the scope of the present invention shall be defined by the sprit of technical thought with reference to the appended claims, not by the embodiments set forth herein.

What is claimed is:

1. A light emitting device comprising at least an n-type compound semiconductor layer, an active layer, and a p-type compound semiconductor layer which are disposed between an n-type electrode layer and a p-type electrode layer,
    wherein the p-type electrode comprises first and second electrodes, each electrode having a different resistance and reflectance,
    wherein the first electrode is a lanthanum nickel oxide film having a predetermined thickness, and
    wherein the second electrode is a film made of a material selected from the group consisting of silver (Ag), aluminum (Al), rhodium (Rh), and tin (Sn).

2. A light emitting device comprising:
    a transparent substrate;
    an n-type compound semiconductor layer formed on the transparent substrate;
    an active layer formed on a first region of the n-type compound semiconductor layer;
    a p-type compound semiconductor layer formed on the active layer;
    a contact resistance reducing film formed on the p-type compound semiconductor layer;
    a p-type electrode formed on the contact resistance reducing film; and an n-type electrode formed on a second region separated from the first region of the n-type compound semiconductor layer,
    wherein the contact resistance reducing film is a lanthanum nickel oxide film, and
    wherein the p-type electrode is a film made of a material selected from the group consisting of silver (Ag), aluminum (Al), rhodium (Rh), and tin (Sn).

* * * * *